United States Patent [19]

Shimazaki et al.

[11] Patent Number: 4,733,187
[45] Date of Patent: Mar. 22, 1988

[54] NMR IMAGING APPARATUS

[75] Inventors: Toru Shimazaki; Yoshihiko Watanabe; Yasuo Imanishi, all of Tokyo, Japan

[73] Assignee: Yokogawa Medical Systems, Limited, Tokyo, Japan

[21] Appl. No.: 23,558

[22] PCT Filed: Jun. 12, 1986

[86] PCT No.: PCT/JP86/00294
§ 371 Date: Jan. 23, 1987
§ 102(e) Date: Jan. 23, 1987

[87] PCT Pub. No.: WO86/07460
PCT Pub. Date: Dec. 18, 1986

[30] Foreign Application Priority Data

Jun. 12, 1985 [JP] Japan .................. 60-128896

[51] Int. Cl.⁴ .......................................... G01R 33/20
[52] U.S. Cl. .................... 324/312; 324/309; 324/322; 364/414
[58] Field of Search ............... 324/307, 309, 312, 318, 324/322; 364/413, 414

[56] References Cited

U.S. PATENT DOCUMENTS 4,034,191  7/1977  Tomlinson et al. ........... 324/312
4,355,282 10/1982  Young et al. ................. 324/309
4,634,979  1/1987  Riederer et al. .............. 324/312
4,652,827  3/1987  Eguchi et al. ................. 324/312
4,665,365  5/1987  Glover et al. ................. 324/309

FOREIGN PATENT DOCUMENTS 138845 11/1977 Japan .
 77042  6/1979 Japan .
 29684  2/1985 Japan .

Primary Examiner—Stewart J. Levy
Assistant Examiner—Kevin D. O'Shea
Attorney, Agent, or Firm—Moonray Kojima

[57] ABSTRACT

An NMR imaging apparatus of the present invention which is provided with an improved data acquiring means 16 and which is useful for enhancement of the speed of reconstruction of an image in NMR imaging by a multislice multiecho method is characterized in that a raw data memory 18 which is provided for storing raw data for the maximum number of slices that can be acquired in one scanning separately from the memory 10 of a computer system 6, and an address converter 19 for converting the addressses of the measured data supplied subsequently in accordance with the sequence of the multislice multiecho method and for storing the measured data in the raw data memory 18 in the arrangement different from the order of acquisition are disposed in a data acquiring device, so that a data block for each slice is formed in the raw data memory 18.

2 Claims, 8 Drawing Figures

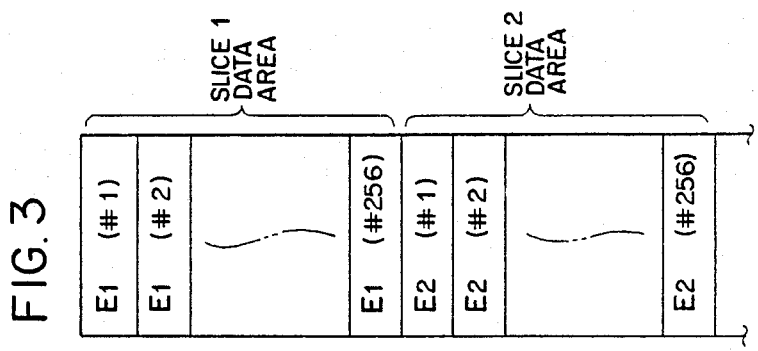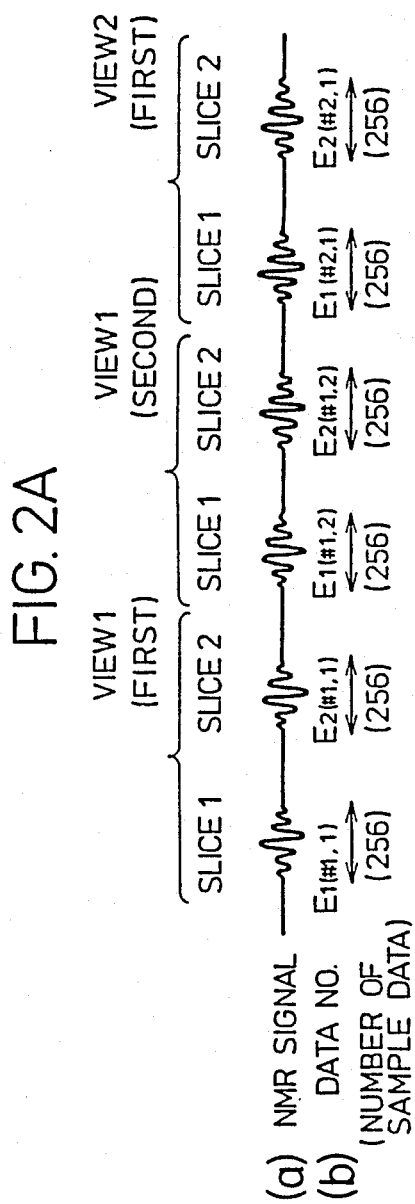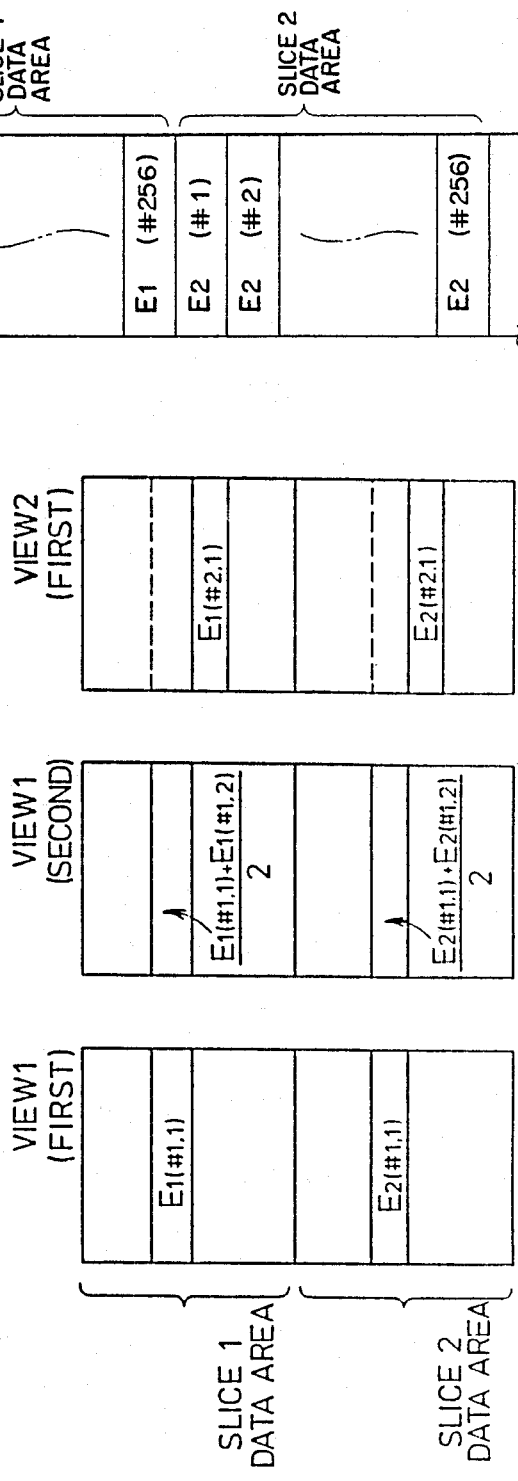

4,733,187

NMR IMAGING APPARATUS

TECHNICAL FIELD

The present invention relates to an NMR imaging apparatus which is provided with an improved data acquiring device and which is useful for enhancement of the speed of reconstruction of an image.

BACKGROUND OF ART

A conventional NMR imaging apparatus is, as shown in FIG. 4, composed of a static magnetic field coil 2 which is urged by a power source and driver 1 for generating a uniform and stable static magnetic field; a probe head (RF coil) 4 which is urged by the power source and driver 1 for generating an RF pulse, and which detects an NMR signal of an object to be examined and supplies it to a preamplifier and detector 3; a gradient magnetic field coil 5 which is urged by the power source and driver 1 for generating linear gradient magnetic fields in the three directions of x, y and z which overlap the static magnetic field; an A/D converter 14 for converting an output signal of the preamplifier and detector 3 into digital data; and a computer system 6 for controlling the power source and driver 1 and the preamplifier and detector 3 and for processing the digital data supplied from the A/D converter 14. The computer system 6 is composed of a central processing unit (CPU) 7, a sequence controller 8, an image display (CRT) 9, a memory (DISK) 10, an array processor (AP) 11 provided with a high-speed memory, an input/output device (I/O) 12, a system bus 13 for connecting these members 7 through 12 to each other, and an A/D converter 14 connected to the I/O 12.

FIG. 5 schematically shows the relationship between a slice and a view with respect to an object to be examined in the case of acquiring data by a multislice multiecho method (hereinunder an image at the same slice which has a different echo time will be defined as a slice in a broad sense), for example, by the Fourier method by means of such a conventional NMR imaging apparatus. In FIG. 5, the reference numeral 15 represents an object to be examined, and the symbol m represents the number of slices and n the number of views. Ordinarily, k items of sample data are acquired in one measurement, and such measurement is repeated j times per view in order to obtain the average measured data.

The operation of the NMR imaging apparatus is as follows. In the actual apparatus, the number m of slices is typically 32 and the number j of measurements for averaging is typically 8, but hereinunder it is assumed that the number m of slices is 2, the number n of views 256, the number of items of data 256, and the number j of measurements 2, for the purpose of simplifying the explanation.

When the sequence controller 6 drives the power source and driver 1 at a constant timing on the basis of a command from the CPU 7, the probe head 4 is energized and the current of the gradient magnetic filed coil 5 is turned on and off, as is required for measurement of an NMR signal. It goes without saying that a uniform and static magnetic field has been generated in advance by the static magnetic field coil 2. After the base band of an NMR signal received by the probe head 4 is converted into an audio frequency by the preamplifier and detector 3, the NMR signal is supplied to the A/D converter 14.

The pulse sequence at this time is carried out in such a manner as is indicated by (a), (b), (c) and (d) in FIG. 6. (a), (b), (c) and (d) in FIG. 6 represent the timing for energizing the probe head, and the timings for applying gradient magnetic field in the directions of x, y and z, respectively. In correspondence with these operations, an NMR signal such as a free induction decay signal (FID signal) indicated by (e) in FIG. 6 is detected.

NMR signals $E_m/(\#n, j)$ are acquired in the order of detection as shown in the column A of FIG. 7, and are stored in the DISK 10 in that order. The measured value of an NMR signal $E_m (\#n, j)$ is composed of k items of sample data. The data stored in the DISK 10 are arranged in such a manner that the data measured at a first time at one view are arranged in the order of slices, and the data measured at a second time in the same view are next arranged in the order of slices, and such arrangement is repeated for every view. Therefore, measured data are very complicated with respect to a slice, and the data on the same slice are not collected at the same place. The CPU 7 calculates $\{E_1(\#1, 1) + E_1(\#1, 2)\}/2$ to obtain the average value of the data $E_1(\#1, 1)$ on the slice 1 measured at first time at a view 1 and the data $E_2(\#1, 2)$ on the slice 1 measured at a second time at the view 1. The average value $E_1(\#1)$ obtained is re-stored in the DISK 10 as a raw data on the slice 1 at the view 1. The CPU 7 executes a similar averaging calculation about all the data on each slice at all the views, and all the average values obtained are subsequently re-stored in the DISK 10. Thus, the averaged raw data $E_1(\#1), E_2(\#1), \ldots E_1(\#256), E_2(\#256)$ are re-stored in the DISK 10 in the order shown in the column B of FIG. 7. In this state, the arrangement of the data is still complicated with respect to a slice.

When the image is reconstructed, the CPU 7 picks up the data $E_1(\#1), E_1(\#2), \ldots E_1(\#256)$ on the slice 1, for example, from the data stored in this state, as shown in the column C of FIG. 6, and the AP 11 reconstructs the image of the slice 1 on the basis of the collected data. The reconstructed image is displayed on the CRT 9. When the image of the slice 2 is reconstructed, the CPU 7 and the AP 11 execute a similar processing on the data $E_2(\#1), E_2(\#2), \ldots E_2(\#256)$.

Such a conventional NMR imaging apparatus is disadvantageous in that since measured data are stored in a large-capacity memory in the order of acquisition in a complicated state with respect to a slice, and an image is reconstructed by picking up raw data on the corresponding slice from data stored in such a state, a heavy load is applied to the CPU 7 or the AP 11, so that the speed of reconstruction of a image is lowered.

DISCLOSURE OF THE INVENTION

Accordingly, it is an object of the present invention to provide an NMR imaging apparatus which is provided with an improved data acquiring device and which is useful for enhancement of the speed of reconstruction of an image.

An NMR imaging apparatus according to the present invention is characterized in that a raw data memory 18 which is provided for storing raw data for the maximum number of slices that can be acquired in one scanning separately from the memory of a computer system, and an address converter 19 for converting the addresses of the measured data supplied subsequently in accordance with the sequence of the multislice multiecho method and for storing the measured data in the raw data memory 18 in the arrangement different from the order of acquisition are disposed in a data acquiring device, so that a data block for each slice is formed in the raw data memory.

BRIEF DESCRIPTION OF THE DRAWINGS

FIG. 2A shows the sequence for measuring an NMR signal in an embodiment of the present invention;

FIGS. 2B and 3 are memory maps showing the stored state of raw data;

BEST MODE FOR CARRYING OUT THE INVENTION

The present invention will be explained in detail hereinunder with reference to the accompanying drawings.

Figure 1:
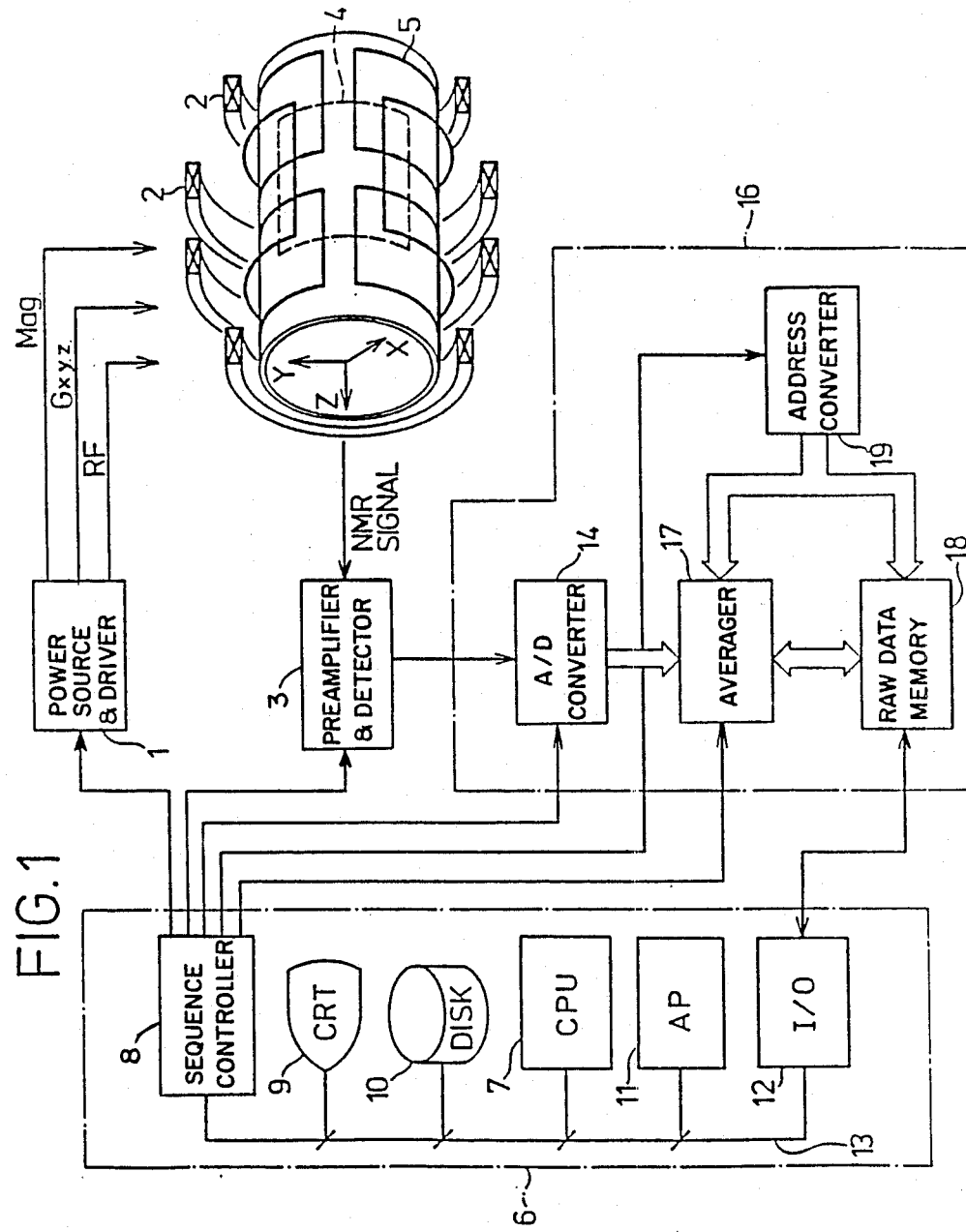
FIG. 1 shows the structure of an embodiment of the present invention.
Figure 4:
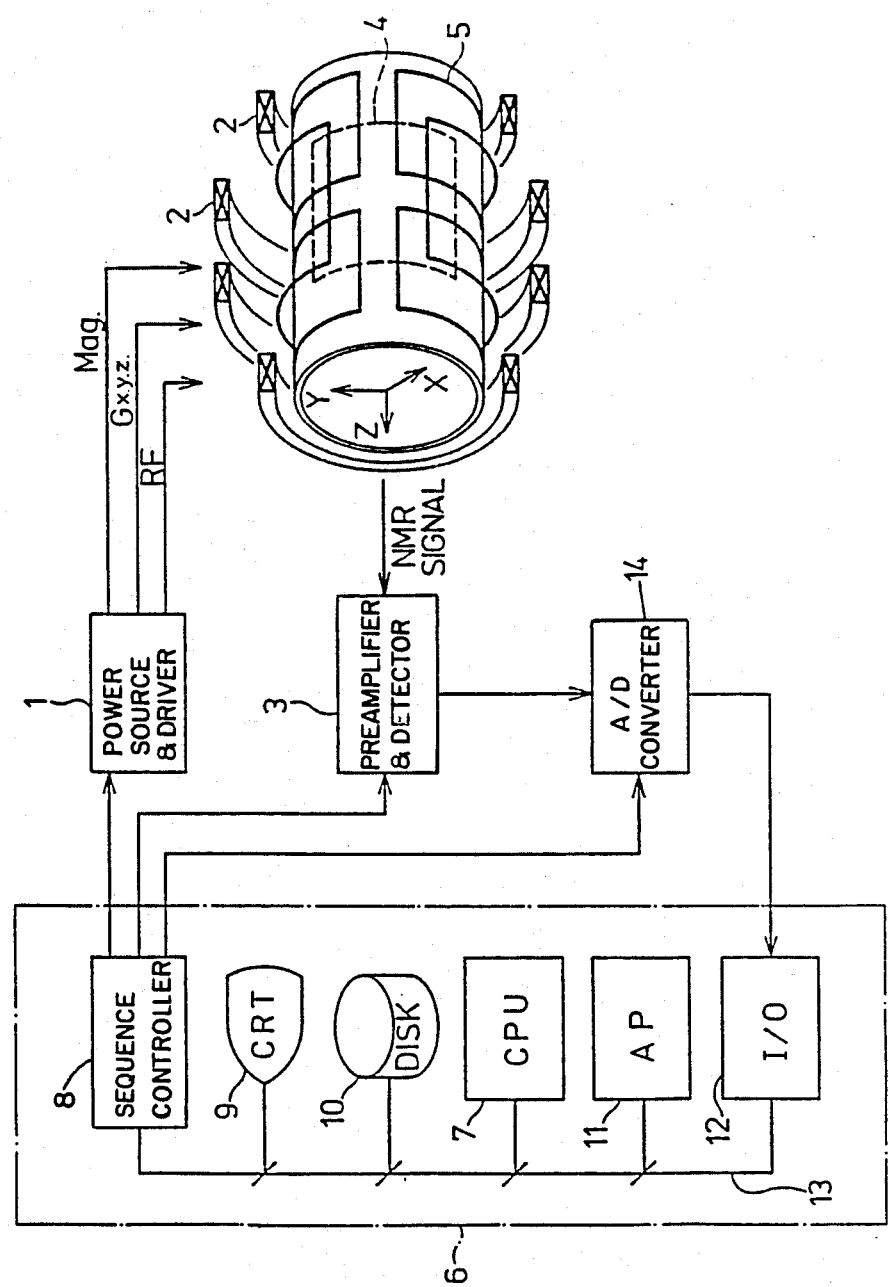
FIG. 4 shows the structure of a conventional apparatus.
Figure 5:
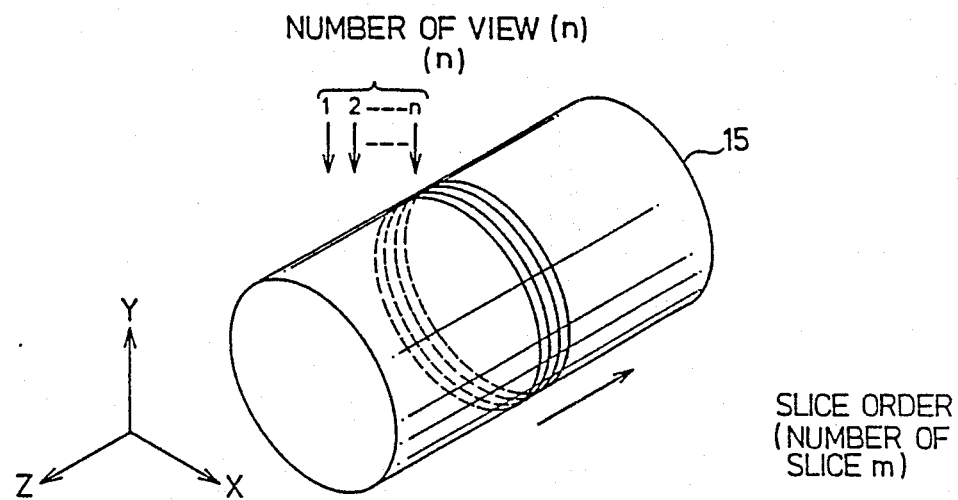
FIG. 5 is an explanatory view of data acquisition by a multislice method.
Figure 6:
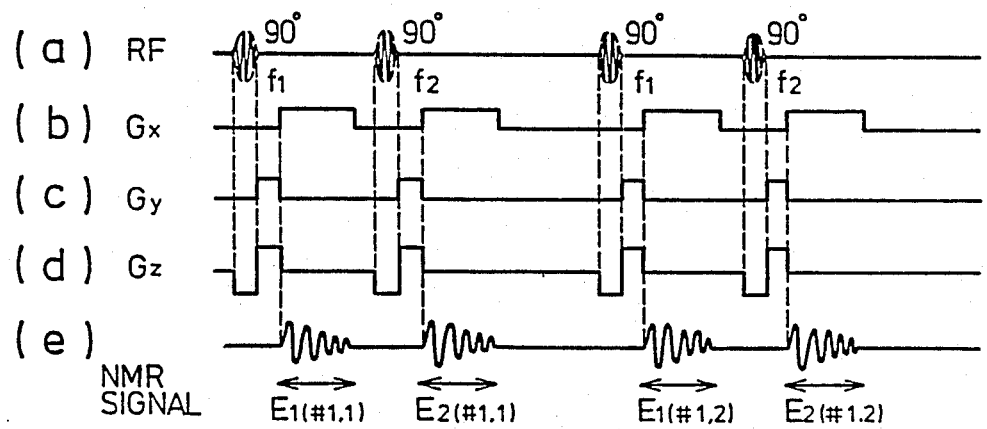
FIG. 6 shows the sequence for measuring an NMR signal by a multislice method.
Figure 7:
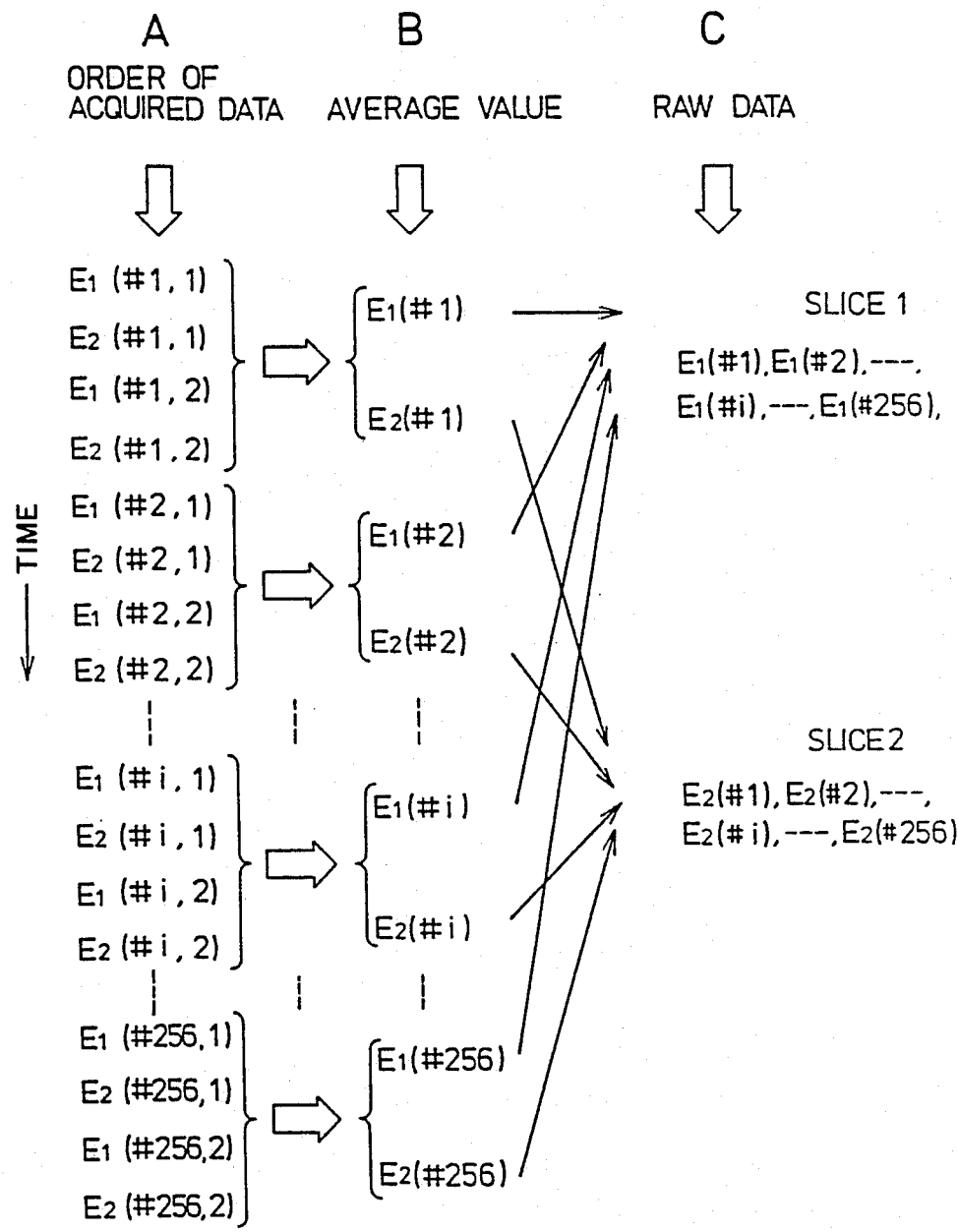
FIG. 7 is an explanatory view of the data acquisition and data processing in the prior art.

FIG. 1 shows the structure of an embodiment of the present invention. In FIG. 1, since the same numerals are provided with the elements which are same as those in FIG. 4, explanation thereof will be omitted. The reference numeral 16 represents a data acquiring device including the A/D converter 14, and is provided with an averager 17 for averaging the output data of the A/D converter 14, a raw data memory 18 to which the output data of the averager 17 are supplied, and an address converter 19 for supplying an address signal to the averager 17 and the raw data memory 18. The address converter 19 converts the addresses of the output data of the A/D converter 14 before storing them in the raw data memory 18, so that the data which are supplied in a complicated order with respect to a slice are stored in each slice area which is provided in the raw data memory 18 in accordance with the slice numbers of the respective data. The A/D converter 14, the averager 17 and the address converter 19 are controlled by the sequence controller 8. The data of the raw data memory 18 are transferred to the DISK 10 through the I/O 12.

The operation of the embodiment will now be explained. It is also assumed that the number m of slices is 2, the number n of views 256, the number of items of data 256, and the number j of measurements 2, as in FIG. 4.

The sequence controller 8 drives the power source and driver 1 under the control of the CPU 7 in the same way as in the prior art. That is, the following steps (a) to (e) are executed.

(a) An NMR signal is measured at the view No. 1 and the slice 1.

(b) An NMR signal is measured at the view NO. 1 and the slice 2.

(c) The steps of (a) and (b) are repeated for a second time.

(d) The steps of (a), (b) and (c) are subsequently repeated with 1 being added to the view number.

(e) The step (d) is repeated until the view number reaches 256.

NMR signals indicated by (a) in FIG. 2A are generated by the above-described operation, and are subsequently detected by the probe head 4. The detected NMR signals are converted into digital data by the A/D converter 14 and supplied to the averager 17 in the form of a train of data indicated by (b) in FIG. 2A, namely, $E_1(\#1, 1)$, $E_2(\#1, 1)$, $E_1(\#1, 2)$, $E_2(\#1, 2)$...

The averager 17 outputs a first measured data as it is and writes it into the data memory 18, but when the averager 17 fetches a second or later measured data, it reads the preceding measured data from the raw data memory 18 and outputs the average value of the preceding measured data and the data fetched at that time. Such operation of the averager 17 is executed under the control of the sequence controller 18. The address for writing and reading measured data is supplied from the address converter 19. Therefore, when the data $E_1(\#1, 1)$ and $E_2(\#1, 1)$ are subsequently input to the averager 17 in the steps (a) and (b), they are output as they are, and are stored in the address for data $E_1(\#1)$ in a slice 1 data area and in the address for data $E_2(\#1)$ in a slice 2 data area, respectively, as shown in FIG. 2B, on the base of the addresses assigned by the address converter 17. When the data $E_1(\#1, 2)$ and $E_2(\#1, 2)$ are input to the averager 17 in accordance with the operation in the step (c), the respective preceding data $E_1(\#1, 1)$ and $E_2(\#1, 1)$ are input from the respective area synchronously with the input of the respective data $E_1(\#1, 2)$ and $E_2(\#1, 2)$, and $\{E_1(\#1, 1)+E_1(\#1, 2)\}/2$ and $\{E_2(\#1, 1)+E_2(\#1, 2)\}/2$ are calculated to obtain the respective average values. The results of calculation are output and these output data are re-stored in the address for data $E_1(\#1)$ in the slice 1 data area and in the address for data $E_2(\#1)$ in the slice 2 data area, respectively, on the basis of the addresses assigned by the address converter 19. In the same way, every time the averager 17 fetches the data from the A/D converter 14, the above-described operation is repeated in combination with the address converter 19. Accordingly, the raw data memory 18 contains the data $E_1(\#1)$, $E_1(\#2)$, ..., $E_1(\#256)$ in the slice 1 data area, and $E_2(\#1)$, $E_2(\#2)$, ..., $E_2(\#256)$ in the slice 2 data area after one scanning, as shown in FIG. 3. In other words, data on each slice which are necessary for reconstruction of an image are stored collectively in the area corresponding to the respective slice in the raw data memory 18.

As described above, since the averager 17 calculates an average value at a real time, the raw data memory 18 need not have an area for storing the data measured a plurality of times so long as it is provided with a capacity for storing data for one scanning.

After one scanning, the data in the raw data memory 18 are transferred to and stored in the DISK 10 while maintaining the arrangement in which data are collected for each slice. In order to reconstruct an image, the AP 11 reads the data necessary for reconstruction of the image from the area in which the data on the desired slice are stored, and conducts a predetermined processing. Since the data necessary for reconstruction of the image are collected in an area for each slice, it is possible to read the data with high efficiency, thereby enabling the image to be reconstructed with a high speed.

The present invention does not limit the number of views, the number of slices, nor the order of data acquisition to that of this embodiment.

While the best mode for carrying out the present invention has been described, it will be obvious to those skilled in the art that various changes and modifications may be made without departing from the scope of the following claims.

What is claimed is:

1. An NMR imaging apparatus having:

magnetic field applying means 1, 2, 4 and 5 for applying magnetic fields for measuring an NMR signal to an object to be examined;

measuring means 3 and 4 for measuring said NMR signal produced on said object to be examined;

an A/D converter 14 for converting a measuring signal output from said measuring means into digital data; and a computer system 6 including a sequence controller 8 for controlling said magnetic field applying means in accordance with a sequence based on a multislice multiecho method (an image at the same slice which has a different echo time is defined as a slice in a broad sense), a memory 10 in which digital data converted by said A/D converter is stored, and a central processing unit 7 for controlling said sequence controller and reconstructing a tomogram of said object to be examined on the basis of said digital data stored in said memory;

characterized in that said NMR imaging apparatus is provided with a raw data memory 18 which is capable of storing output data of said A/D converter for the maximum number of slices that are acquired at least one scanning and is capable of transferring the stored data for at least one scanning to said memory of said computer system; and an address converting means for converting the address of output data of said A/D converter before said data is stored in said raw data memory so that a block of raw data for each slice is formed in said raw data memory.

2. An NMR imaging apparatus having:

magnetic field applying means 1, 2, 4 and 5 for applying magnetic fields for measuring an NMR signal to an object to be examined;

measuring means 3 and 4 for measuring said NMR signal produced on said object to be examined;

an A/D converter 14 for converting a measuring signal output from said measuring means into digital data; and a computer system 6 including a sequence controller 8 for controlling said magnetic field applying means in accordance with a sequence based on a multislice multiecho method (an image at the same slice which has a different echo time is defined as a slice in a broad sense), a memory 10 in which digital data converted by said A/D converter is stored, and a central processing unit 7 for controlling said sequence controller and reconstructing a tomogram of said object to be examined on the basis of said digital data stored in said memory;

characterized in that said NMR imaging apparatus is provided with an averaging means 17 for averaging digital data output from said A/D converter in accordance with measurements executed a plurality of times at the same slice and the same view;

a raw data memory 18 which is capable of storing output data of said averaging means for the maximum number of slices that are acquired at at least one scanning and is capable of transferring the stored data for at least one scanning to said memory of said computer system; and an address converting means for converting the address of output data of said averaging means before said data is stored in said raw data memory so that a block of raw data for each slice is formed in said raw data memory.

* * * * *